US005682297A

United States Patent [19]
Silva

[11] Patent Number: 5,682,297
[45] Date of Patent: *Oct. 28, 1997

[54] DUAL PATTERN MICROPROCESSOR PACKAGE FOOTPRINT

[75] Inventor: David J. Silva, Trabuco Canyon, Calif.

[73] Assignee: AST Research, Inc., Irvine, Calif.

[*] Notice: The term of this patent shall not extend beyond the expiration date of Pat. No. 5,557,505.

[21] Appl. No.: 615,155

[22] Filed: Mar. 12, 1996

Related U.S. Application Data

[63] Continuation of Ser. No. 278,798, Jul. 22, 1994, Pat. No. 5,557,505.
[51] Int. Cl.[6] ............................................... H05K 1/18
[52] U.S. Cl. ...................... 361/777; 361/776; 361/760; 174/260; 174/261; 29/832; 257/797; 257/792
[58] Field of Search .................................. 361/767, 772, 361/777, 760, 773, 783; 174/250, 260, 261, 262; 29/832, 837, 840; 228/179.1, 180.1, 180.21, 180.22; 257/697, 692, 695, 700, 723, 724, 778; 439/68

[56] References Cited

U.S. PATENT DOCUMENTS 4,530,002  7/1985  Kanai ........................................ 357/68

FOREIGN PATENT DOCUMENTS

| 0 171 232 | 7/1985 | European Pat. Off. . |
| 0 246 088 | 5/1987 | European Pat. Off. . |
| 2 170 047 A | 1/1986 | United Kingdom . |
| 2 233 823 A | 7/1990 | United Kingdom . |

*Primary Examiner*—Laura Thomas
*Attorney, Agent, or Firm*—Knobbe, Martens, Olson & Bear, LLP

[57] ABSTRACT

A dual footprint for servicing either of two types of microprocessor packaging systems. A first footprint capable of receiving and servicing a first type of microprocessor packaging system, for example, a tape carrier package microprocessor package, is formed within a second footprint capable of receiving and servicing a second type of microprocessor packaging system, for example, a pin grid array microprocessor package. In a preferred form, the two footprints are electrically interconnected and the first footprint is offset by a selected angle from the second footprint to allow increased connectivity between the two footprints.

2 Claims, 7 Drawing Sheets

DUAL PATTERN MICROPROCESSOR PACKAGE FOOTPRINT

This is a continuation of application Ser. No. 08/278,798, filed on Jul. 22, 1994 now U.S. Pat. No. 5,557,505.

FIELD OF THE INVENTION

The field of the present invention is integrated circuit packaging footprints for use on printed circuit boards and, more particularly, footprints for receiving and servicing pin grid array (PGA) or tape carrier package (TCP) type microprocessor packages.

DESCRIPTION OF THE PRIOR ART

Presently, two types of packaging systems for mounting microprocessors (for example, Intel p5c or 486 microprocessors) to a printed circuit board are preferred by the personal computer industry. The first developed, and most widely utilized, packaging system is the pin grid array (PGA) packaging system. A typical PGA package comprises a casing or housing for supporting and providing electrical connections to the pins of a microprocessor, a plurality of pins mounted to the base of the housing, and a plurality of leads for connecting selected pins of the microprocessor to selected pins of the PGA package. A typical PGA package is mounted to a printed circuit board by inserting the pins of the PGA package into a plurality of pin receptors formed within the printed circuit board. The pattern of the pin receptors formed within the printed circuit board is commonly referred to as the PGA package footprint, and an exemplary 320 pin PGA package footprint is illustrated in FIG. 1.

The second packaging system presently utilized by the personal computer industry is the tape carrier package (TCP) system. A typical TCP packaging system comprises a casing or housing for receiving and providing electrical connections to the pins of a microprocessor, a plurality of land patterns each including a plurality of exposed conductor trace segments formed on the underside of the housing, and a plurality of leads for connecting selected pins of the microprocessor to selected conductor trace segments within the land patterns. Typically, a TCP package is mounted to a printed circuit board by coupling the land patterns of the TCP package to a similar set of land patterns provided on the circuit board. The land patterns provided upon the surface of a printed circuit board are commonly referred to as a TCP package footprint. The TCP package is coupled to the circuit board via conventional means (for example, by hot bar bonding techniques). An exemplary footprint for a TCP package is illustrated in FIG. 2.

Those skilled in the art will appreciate that the personal computer manufacturing industry is highly competitive, and that profit margins are often extremely small. Indeed, system design changes capable of yielding a ½ cent per unit savings in production costs are routinely implemented to maintain a competitive market position. With such tight margins, it is readily apparent that fluctuations in the availability or cost of personal computer components may have a substantial effect on the overall profitability of a product line. For example, when large quantities of printed circuit boards are obtained for use with, for example, a PGA type microprocessor packaging system, a fluctuation in the price of PGA packaging systems or the availability of PGA packaging systems may have a profound effect on the profitability of a computer line employing those boards. Further, if PGA packaging systems cannot be obtained, new boards capable of supporting a different packaging system (for example, a TCP type packaging system) will need to be obtained, resulting not only in increased costs, but also in substantial manufacturing delays. Such a scenario is unacceptable in the highly competitive personal computer market. Accordingly, where steps can be taken to minimize and stabilize component supply costs or to insure component availability, it is often highly desirable to implement those steps in the personal computer manufacturing process.

To take advantage of, or conversely to protect against, fluctuations in the cost and availability of PGA and TCP microprocessor packaging systems, it would be desirable to provide both a PGA package footprint and a TCP package footprint on the printed circuit (PC) boards utilized by a given line of computers and, hence, to provide the capability of using either packaging system within a personal computer line. However, it will be appreciated by those skilled in the art that, if two distinct footprints are provided upon a circuit board, substantial space may be wasted on the board. This may result in increased manufacturing costs and, more importantly, may make it extremely difficult to meet board design specifications (for example, surface area restrictions).

It follows that a dual footprint for a PC board capable of receiving and servicing both TCP and PGA microprocessor packaging systems, while occupying a minimum amount of PC board space, would be quite beneficial to the personal computer manufacturing industry.

SUMMARY OF THE INVENTION

In a broad aspect, the present invention is directed to a dual footprint for use on a PC board which enables the PC board to receive one of two distinct microprocessor packages, while consuming a minimum amount of PC board area. More specifically, the present invention is directed to an innovative dual PGA and TCP footprint for use on a PC board and, hence, to a dual footprint capable of servicing either a PGA type microprocessor package or a TCP type microprocessor package. The present invention is also directed to methods for forming such a dual footprint on a PC board.

In one preferred embodiment, the dual footprint of the present invention comprises a TCP footprint disposed within a PGA footprint. It may be noted that this implementation insures that only a minimum amount of board surface area is utilized by a dual footprint in accordance with the present invention.

In another preferred embodiment, the TCP footprint is disposed within the PGA footprint and offset from the PGA footprint by a selected angle. By offsetting the TCP footprint in this fashion it is possible to minimize the number of vias and board line layers required to interconnect the TCP and PGA footprints. This implementation also makes it possible to maximize the line widths of conductor traces interconnecting the PGA and TCP footprints.

Accordingly, it is an object of the present invention to provide an improved footprint for use on PC boards and to provide improved methods for implementing the same.

It is a further object of the present invention to provide a dual footprint capable of servicing either a PGA type microprocessor package or a TCP type microprocessor package.

It is a still further object of the present invention to provide a dual footprint which consumes a minimum amount of physical board area on a PC board.

DESCRIPTION OF THE PREFERRED EMBODIMENTS

Figure 1:
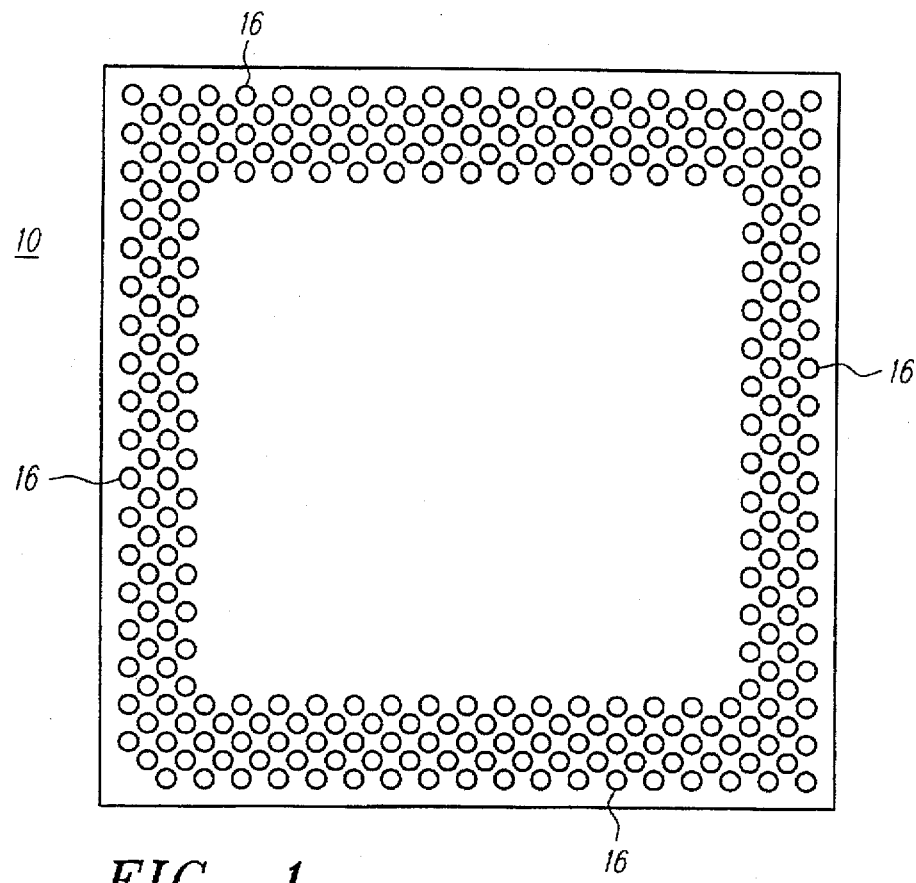
FIG. 1 is an illustration of a PC board footprint of a pin grid array (PGA) type microprocessor package.
Figure 2:
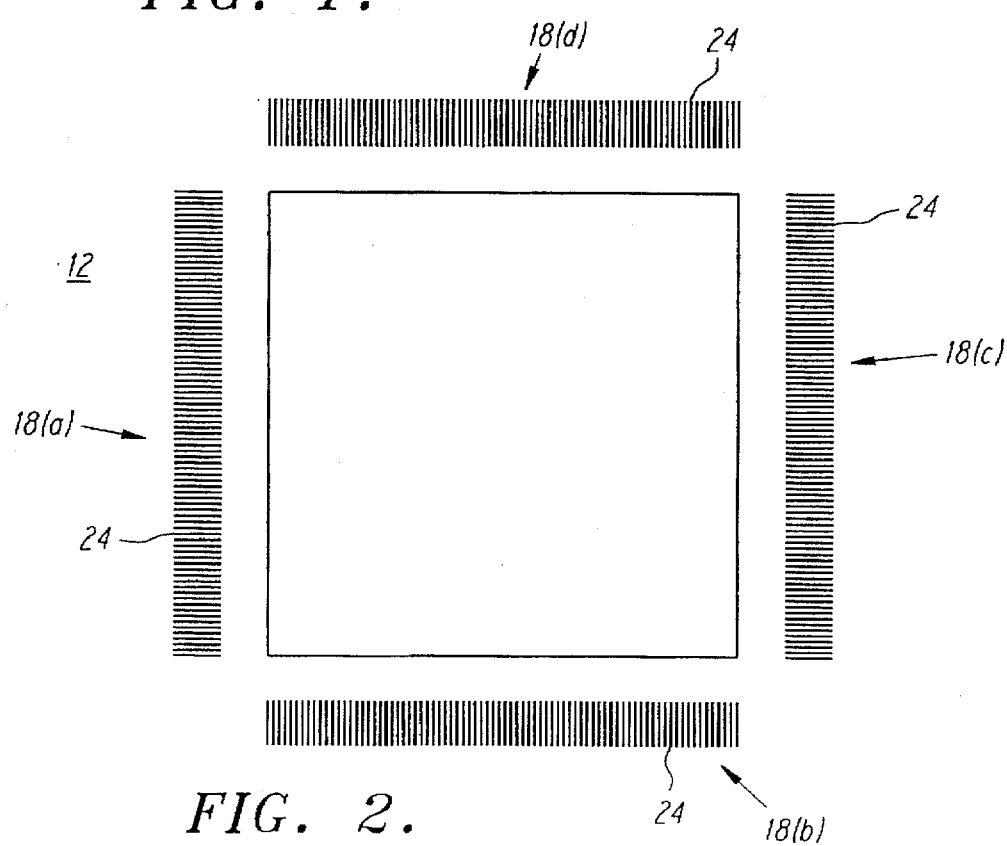
FIG. 2 is an illustration of a PC board footprint of a tape carrier package (TCP) type microprocessor package.

Turning now to the drawings, FIG. 1 illustrates a PC board footprint 10 of a pin grid array (PGA) type microprocessor package (not shown), and FIG. 2 illustrates a PC board footprint 12 of a tape carrier package (TCP) type microprocessor package (not shown). It may be noted that FIGS. 1 and 2 are not drawn to scale. As explained above, both TCP and PGA packages are presently employed by the personal computer manufacturing industry to attach a microprocessor (for example, an Intel p5c or 486 microprocessor) to a PC board. However, it is difficult to predict future fluctuations in both the cost and availability of these packages and, thus, it is difficult to guard against such fluctuations in cost and availability and to minimize the effect of such fluctuations on the profitability of a personal computer line. For these reasons and others which will be apparent to those skilled in the art, it is highly desirable to utilize PC boards which are capable of servicing either a PGA or TCP type of microprocessor package.

As shown in FIGS. 3, 4, 5(a) and 5(b), a dual footprint 14 in accordance with one form of the present invention provides not only the function of servicing both PGA and TCP type microprocessor packages, but also provides for a minimum utilization of physical board space. More specifically, the dual footprint 14 illustrated in FIGS. 3, 4, 5(a) and 5(b) comprises 320 pin receptors 16, four land patterns 18(a)–(d), and a plurality of vias 20. It may be noted that only representative pin receptors 16, vias 20, and conductor trace segments 24 are denoted in the drawings, as it is believed that labeling each and every pin receptor 16, via 20, and conductor trace segment 24 would unnecessarily clutter the drawings.

Figure 6:
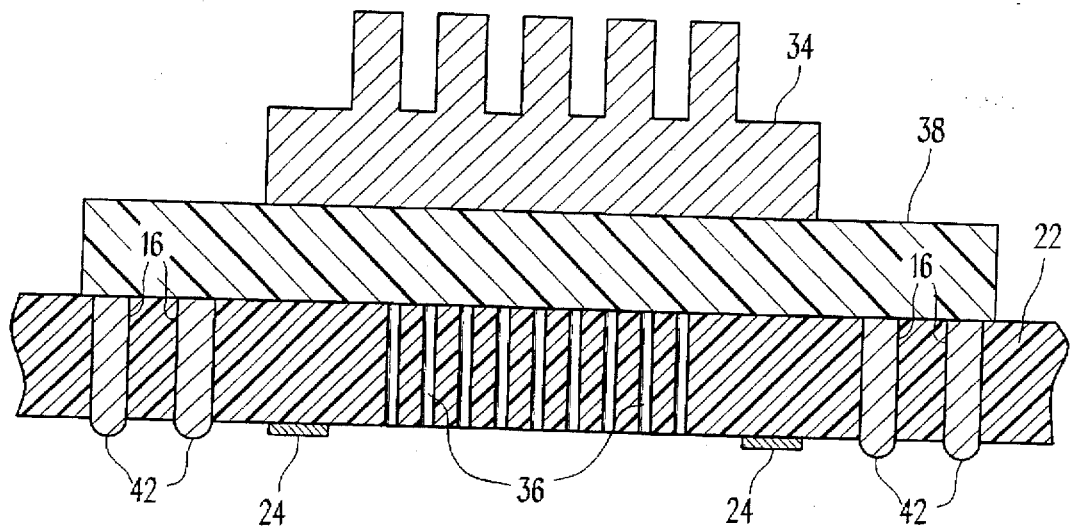
FIG. 6 is a cross-sectional view of a PGA package disposed within a dual footprint in accordance with the present invention.

The pin receptors 16 are arranged in several interspaced rows bordering a first substantially square area on a PC board 22 (shown in FIG. 6). The pin receptors 16 form a PGA footprint similar to that illustrated in FIG. 1. The land patterns 18(a)–(d) are disposed within the square area bordered by the pin receptors 16, and the land patterns 18(a)–(d) form a TCP footprint similar to that illustrated in FIG. 2. Each of the land patterns 18(a)–(d) comprises a set of 80 conductor trace segments 24 disposed one adjacent another and orthogonal to a separate side of a second substantially square area located on the PC board 22. Notably, the first and second square areas are offset by a selected angle, 10° in a preferred form, to enable increased interconnectivity between the pin receptors 16 and the trace segments 24 comprising the land patterns 18(a)–(d). Finally, selected ones of the pin receptors 16 and conductor trace segments 24 are interconnected by a plurality of conductor traces (or etches) 26 and vias 20.

Figure 3:
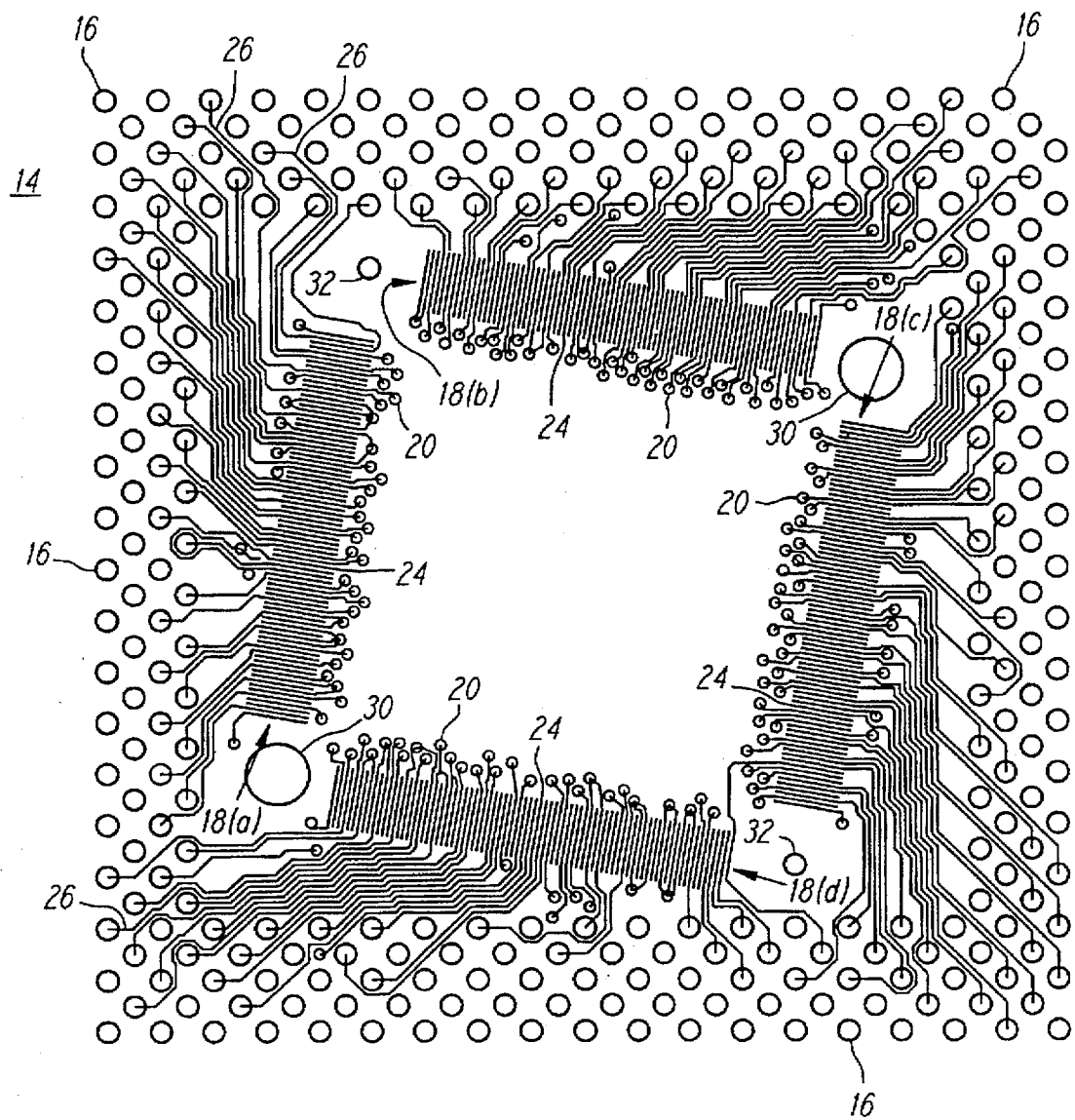
FIG. 3 is an illustration of a first PC board layer having a first portion of a dual TCP and PGA footprint formed thereon.
Figure 4:
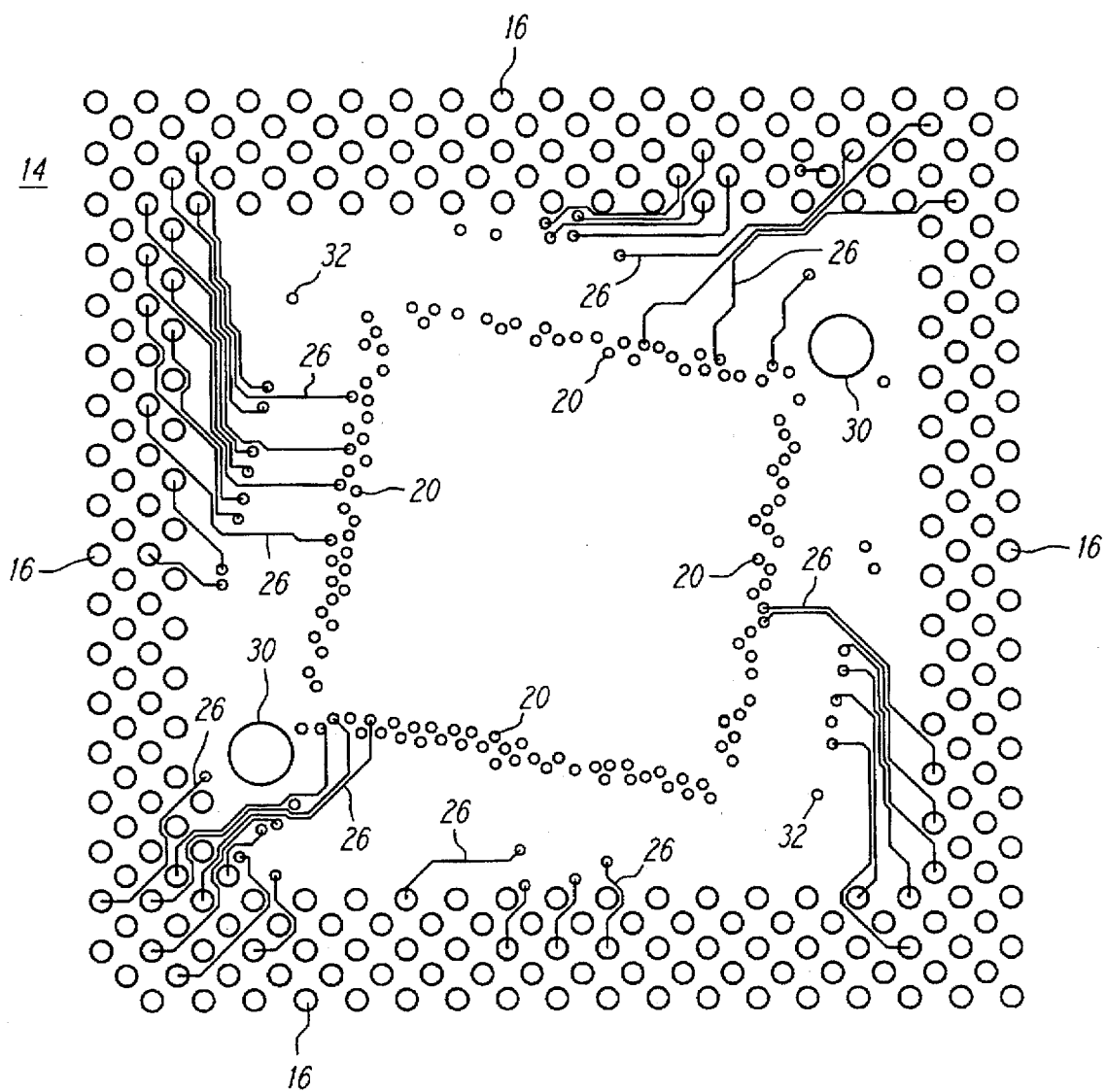
FIG. 4 is an illustration of a second PC board layer having a second portion of a dual TCP and PGA footprint formed thereon.
Figure 5:
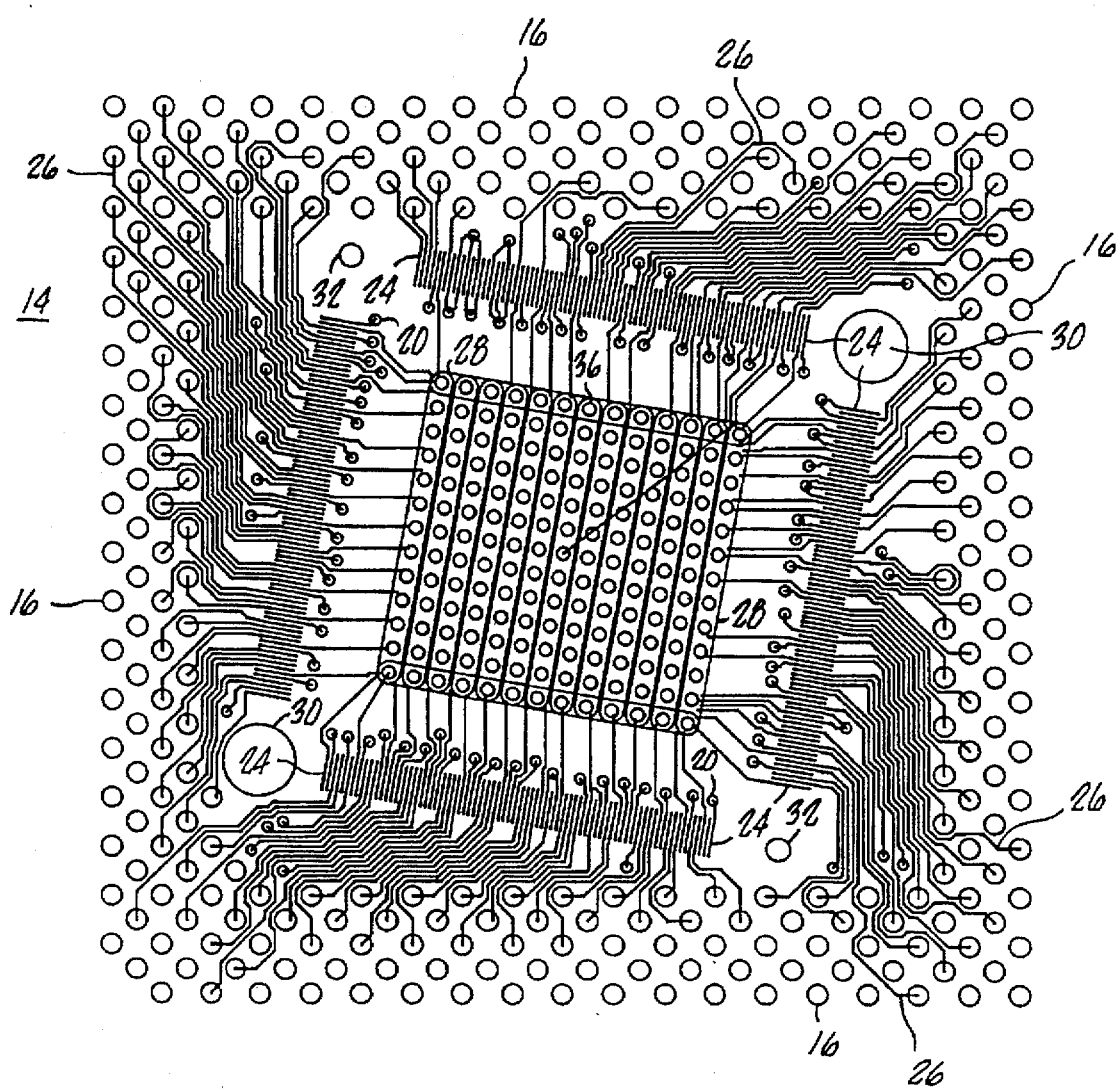
FIG. 5(a) is an illustration of a preferred configuration of a first PC board layer having a first portion of a dual TCP and PGA footprint and heat pad formed thereon.
FIG. 5(b) is an illustration of a preferred configurations of a second PC board layer having a second portion of a dual TCP and PGA footprint and heat pad formed thereon.
FIG. 5(c) is an illustration of a heat pad disposed within a TCP footprint portion of a dual footprint in accordance with a preferred form of the present invention.
Figure 5:
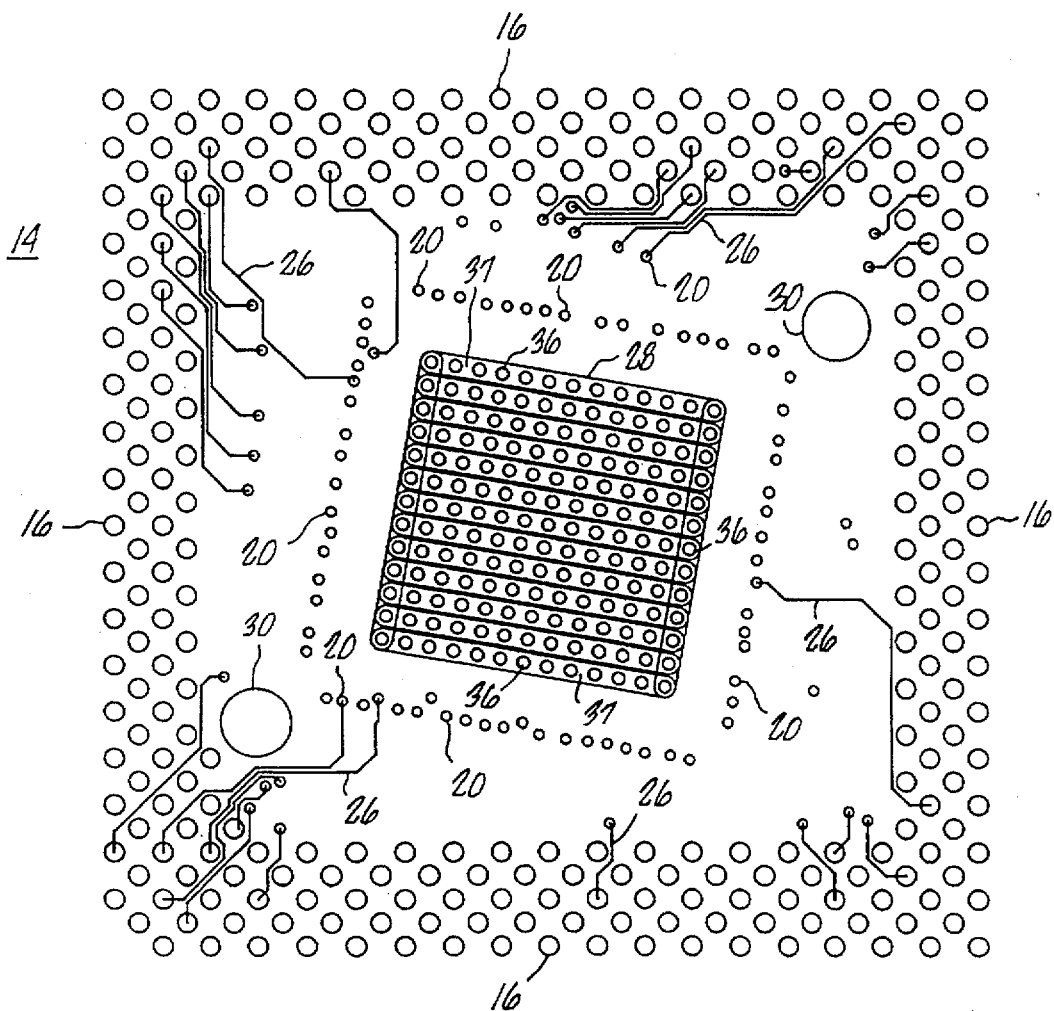

An exemplary pattern of connectivity between the pin receptors 16, the trace segments 24 of the land patterns 18(a)–(d), and the vias 20 is illustrated in FIGS. 3 and 4, and a preferred pattern of connectivity between pin receptors 16, the trace segments 24 of the land patterns 18(a)–18(d), and the vias 20 is illustrated in FIGS. 5(a) and 5(b). Those skilled in the art will appreciate that FIGS. 3 and 4 provide illustrations of two distinct board layers within a single PC board 22. Likewise, FIGS. 5(a) and 5(b) provide illustrations of two distinct board layers within a single PC board 22. When, configured in the manner illustrated in FIGS. 3 and 4 or 5(a) and 5(b), the dual footprint 14 is capable receiving and servicing either a PGA or TCP type microprocessor package. In addition, utilization of physical board space is minimized, and connectivity between the pin receptors 16 and the trace segments 24 of the land patterns 18(a)–(d) is enhanced. These configurations also enable the use of increased trace (or etch) widths for interconnecting the pin receptors 16 and the trace segments 24.

Those skilled in the art will appreciate that, while it may be advantageous and preferred for the PGA footprint and TCP footprint portions of the dual footprint 14 to share a common center point (not shown), the present invention need not be limited to such a configuration. Indeed, so long as the TCP portion of the dual footprint 14 is contained within a perimeter region of the PGA portion of the dual footprint 14, a minimum amount of board surface area will be consumed. It will also be appreciated that, while not necessary, it may be preferable to construct the TCP portion of the dual footprint 14 on one side of a PC board 22 and to construct the PGA portion of the dual footprint 14 on the opposite side of the PC board 22.

Figure 5C:
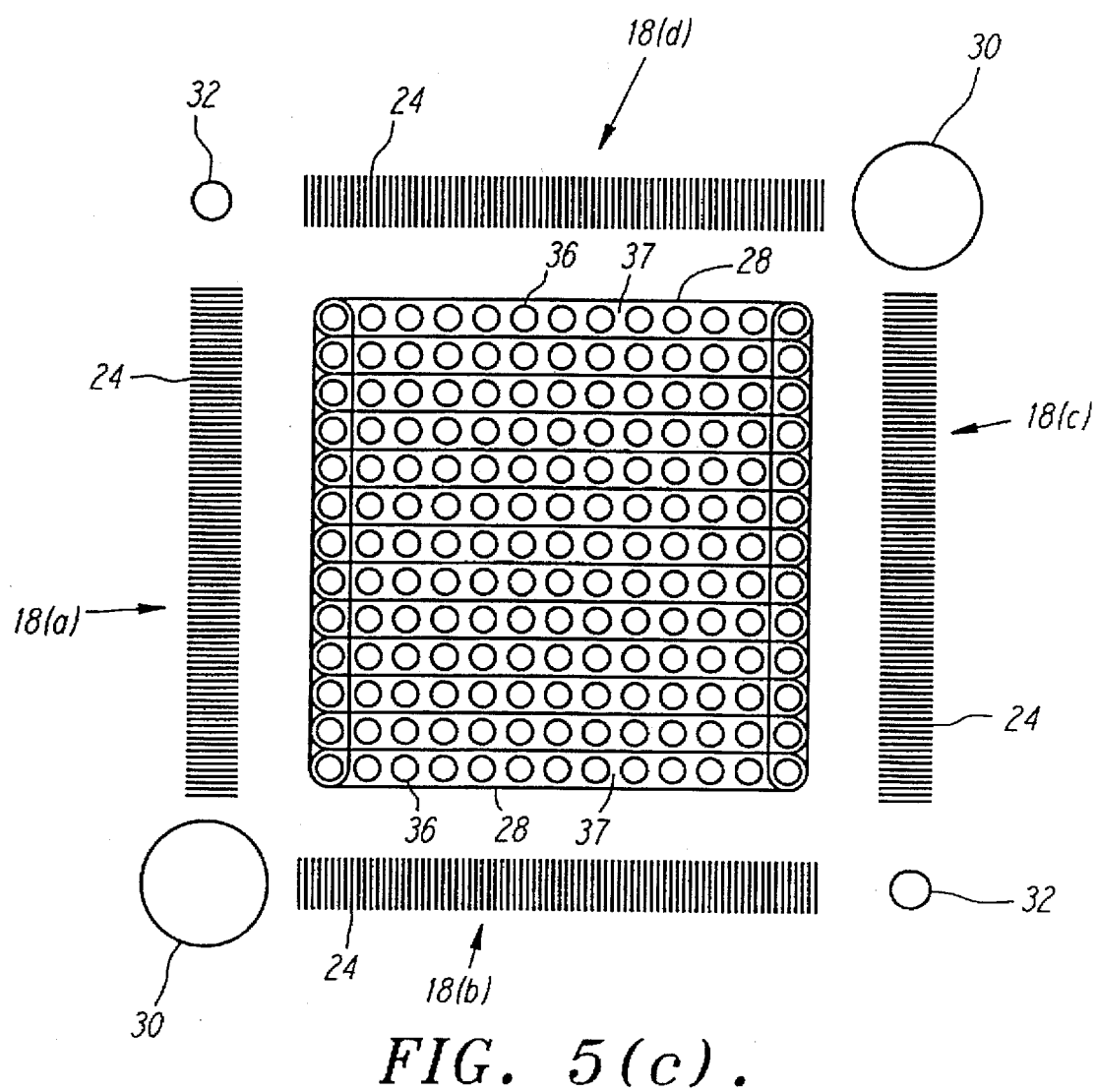

Turning now also to FIG. 5(c), in a preferred form a heat pad 28, a pair of fiducials 30, and a pair of mounting holes 32 may be formed within the TCP footprint portion of the dual footprint 14. The heat pad 28 may be disposed within the dual footprint 14 to allow heat to pass through the PC board 22 to a heat sink 34 (shown in FIG. 7). The heat pad 28 may comprise 169 copper plated holes 36 formed through the PC board 22. The copper plated holes 36 are tied to internal ground layers (not shown) of the PC board 22, and each plated hole 36 is formed to a 0.013" finished drill diameter. In addition, the heat pad area 37 formed upon the surface of the PC board may comprise exposed copper. A heat sink 34 (shown in FIG. 7) may be coupled to the PC board 22 and, more particularly, to the heat pad 30 in a conventional fashion using the mounting holes 32. For example, the heat sink may be bolted to the heat pad 28 using a pair of mounting bolts (not shown). The heat sink 34 may also be glued to the heat pad 30.

Figure 7:
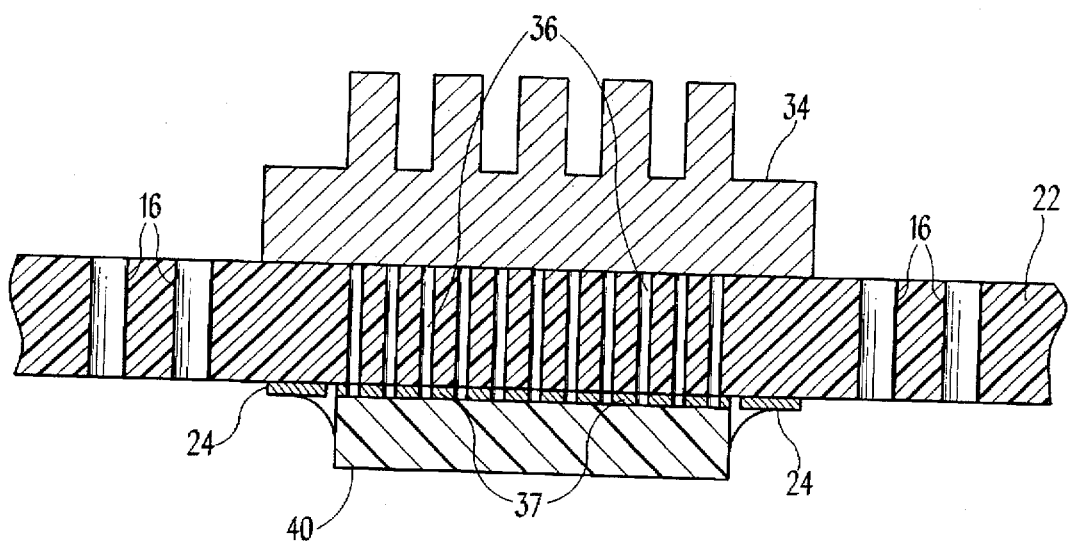
FIG. 7 is a cross-sectional view of a TCP package disposed within a dual footprint in accordance with the present invention.

Now turning to FIGS. 6 and 7, either a PGA type microprocessor package 38 or a TCP type microprocessor package 40 may be coupled to the PC board 22 via the dual footprint 14 in a conventional, fashion. For example, in the case of a PGA type microprocessor package 38 the pins 42 of the PGA package 38 may be inserted into the pin receptors 16 of the dual footprint 14. In the case of a TCP type microprocessor package 40, the TCP package 40 is positioned by conventional means using pick and place imaging equipment upon the TCP footprint land areas of the dual footprint 14, and the TCP package is then hot bar bonded to the land areas.

It may be noted that, when a TCP type microprocessor package 40 is mounted to a PC board using a dual footprint 14 in accordance with the present invention, it may be advantageous to mount the TCP package 40 to one side of the PC board 22 and a heat sink 34 to the other side of the PC board 22, as shown in FIG. 7. In this fashion, sufficient heat dissipation may be achieved, while minimizing the height of components mounted to the PC board. In contrast, if height restrictions do not weigh heavily in the design criteria governing the layout of a PC board 22, or if a PGA type microprocessor package 38 is employed, it may be satisfactory to mount a heat sink 34 upon the dorsal surface 44 of the PGA package 38, as shown in FIG. 6.

Finally, with regard to the manufacture of PC boards including one or more dual footprints 14 in accordance with the present invention, it may be noted that conventional board construction techniques may be employed to create such boards. More specifically, it is well known in the art to submit film board layers (similar to the illustrations of FIGS. 3, 4, 5(a) and 5(b)) to a PC board manufacturer, such as Details, Inc., of Anaheim, Calif., and to have the PC board manufacturer manufacture a selected number of PC boards based upon the submitted film board layers (or specifications). For this reason, the precise steps of manufacturing a PC board are not set forth herein, as those steps are considered to be well known in the art.

While the invention of the subject application is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A dual footprint for a PC board comprising:

a first package array footprint;

a second package array footprint; and a plurality of conductor traces interconnecting said first package array footprint and said second package array footprint such that said first package array footprint and said second package array footprint form a single dual footprint wherein said first package array footprint and said second package array footprint are alternatively capable of servicing a microprocessor package of either a first or second type.

2. The dual footprint of claim 1, wherein said first package array footprint comprises a pin grid array footprint and said second package array footprint comprises a tape carrier package footprint.

* * * * *